(12) United States Patent　　　　　(10) Patent No.:　US 12,671,421 B1

Linzer et al.　　　　　(45) Date of Patent:　Jun. 30, 2026

(54) SYSTEMS, METHODS, AND APPARATUS TO SUPPORT MULTIPLE SYNCHRONOUS CLOCKS WITH A SINGLE CLOCK MESH

(71) Applicant: Marvell Asia Pte Ltd, Singapore (SG)

(72) Inventors: Harry Linzer, Raleigh, NC (US);
Kevin William Gorman, Essex Junction, VT (US); Zahi S. Abuhamdeh, Billerica, MA (US)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 18/954,924

(22) Filed: Nov. 21, 2024

Related U.S. Application Data

(60) Provisional application No. 63/601,744, filed on Nov. 21, 2023.

(51) Int. Cl.
　　H03K 21/02　　(2006.01)
　　H03K 19/173　　(2006.01)
　　H03K 21/08　　(2006.01)

(52) U.S. Cl.
　　CPC ....... H03K 21/023 (2013.01); H03K 19/1737 (2013.01); H03K 21/08 (2013.01)

(58) Field of Classification Search
　　CPC ... H03K 21/023; H03K 21/08; H03K 19/1737
　　USPC .......................................................... 327/117
　　See application file for complete search history.

(56)　　　　　References Cited

U.S. PATENT DOCUMENTS 11,955,981 B2 *　4/2024　Vankayala ............. H03K 19/20
12,463,626 B2 *　11/2025　Lee ......................... H03K 3/037

OTHER PUBLICATIONS

U.S. Appl. No. 18/524,182, filed Nov. 30, 2023.

* cited by examiner

*Primary Examiner* — Tomi Skibinski

(57)　　　　　ABSTRACT

A single clock mesh is configured to provide a first clock signal at a first frequency. A number of divided clock signals are generated, each divided clock signal being at a frequency that is a respective integer division of the first frequency. The divided clock signals are received from a divider and output by a clock controller along with corresponding enable signals. For each divided clock, a shaped clock signal is generated. The shaped clock signal has rising edges and falling edges that algin with rising edges and falling edges of the first clock signal provided by the single clock mesh.

20 Claims, 3 Drawing Sheets

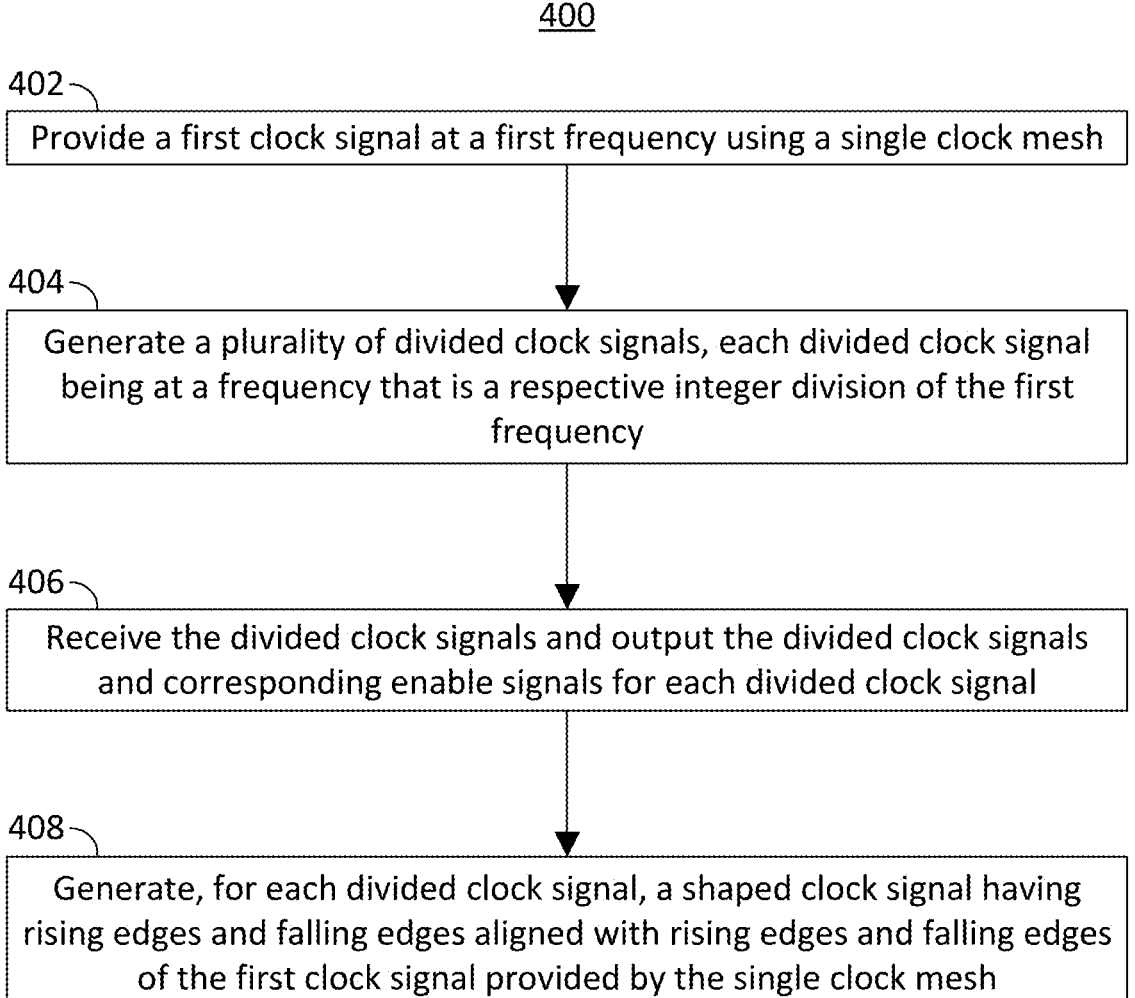

<u>400</u>

402 ⌐

Provide a first clock signal at a first frequency using a single clock mesh

404 ⌐

Generate a plurality of divided clock signals, each divided clock signal being at a frequency that is a respective integer division of the first frequency

406 ⌐

Receive the divided clock signals and output the divided clock signals and corresponding enable signals for each divided clock signal

408 ⌐

Generate, for each divided clock signal, a shaped clock signal having rising edges and falling edges aligned with rising edges and falling edges of the first clock signal provided by the single clock mesh

FIG. 4

SYSTEMS, METHODS, AND APPARATUS TO SUPPORT MULTIPLE SYNCHRONOUS CLOCKS WITH A SINGLE CLOCK MESH

CROSS REFERENCE TO RELATED APPLICATIONS

This disclosure claims the benefit of, commonly-assigned U.S. Provisional Patent Application No. 63/601,744, filed Nov. 21, 2023, which is hereby incorporated by reference herein in its entirety.

FIELD OF USE

This disclosure relates to clock signaling in integrated circuits. More particularly, this disclosure relates to generating and maintaining multiple synchronous clocks using a single clock mesh.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

A clock mesh is a structure commonly used on system-on-a-chip (SOC) designs which run at very high clock rates, typically at least 2.0 GHz, to distribute a clock signal across a large region of a chip. Clock meshes are typically implemented as wires on at least two adjacent and orthogonal layers of metal on a chip and with the wires tied together at each point of intersection. Taps off the mesh are made as needed to service the clocking needs of logic below the mesh. A typical tap would normally service the clocking needs of an area that is in the order of $0.01 \text{ mm}^2$. The mesh enables very tight alignment of clock edges in adjacent areas of the chip enabling operation at very high clock rates.

The logic below the mesh may operate at a different clock speed than that of the clock mesh. For example, the clock mesh may operate at a speed of 2.0 GHz. Some of the logic below the mesh may operate at a speed of 1.0 GHz while other logic below the mesh may operate at a speed of 500 MHz. The primary clock (i.e., the mesh clock) has to be tapped and then divided to reduce the speed in order to support the different clock speeds required by different logic below the mesh. However, simply dividing the primary clock results in clock signals that are not tightly aligned. In other words, the rising and falling edges of the divided clock signals may not align with each other or with the primary clock. This causes timing issues due to, for example, setup-and-hold failures.

SUMMARY

Systems, methods, and apparatus are described herein for supporting multiple synchronous clocks with a single clock mesh. A single clock mesh is configured to provide a first clock signal at a first frequency. A number of divided clock signals are generated, each divided clock signal being at a frequency that is a respective integer division of the first frequency. The divided clock signals are received from a divider and output by a clock controller along with corresponding enable signals. For each divided clock, a shaped clock signal is generated. The shaped clock signal has rising edges and falling edges that algin with rising edges and falling edges of the first clock signal provided by the single clock mesh.

In some implementations, the divided clock signals and corresponding enable signals are received by a multiplexer. The multiplexer then transmits, for each divided clock signal, one of the divided clock signal or its corresponding enable signal.

In some implementations, transmission of a divided clock signal is delayed to ensure transmission of the divided clock signal after a specific number of clock cycles. Transmission of a second clock signal may also be similarly delayed to ensure that the divided clock signal and the second divided clock signal are transmitted during the same clock cycle.

In some implementations, one or more of the divided clock signal are selected and gated. While gating at least one of the divided clock signals, a plurality of flip flops associated with the at least one of the divided clock signals may be scanned. A scan clock signal may be generated at a frequency that is below a frequency of the respective divided clock signal associated with the plurality of flip flops.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which:

FIG. 4 is a flow diagram representing an illustrative process for generating multiple synchronous clocks using a single clock mesh, in accordance with some implementations of the subject matter of this disclosure.

DETAILED DESCRIPTION

In some SOC designs, it is necessary to have two or more synchronous clocks to support the logic which is placed below the clock mesh. Typically, the synchronous clocks are divided clocks, for instance, if the clock mesh is operating at 2.0 GHz, there might be a synchronous divided clock which runs at 1.0 GHz and perhaps another synchronous divided clock which runs at 500 MHz. In order to simplify meeting the timing closure requirements of the logic when logic of one synchronous clock drives logic associated with the other synchronous clock, it is necessary to provide precise alignment of the clocks, including precise alignment of coincident edges of the synchronous clocks. This disclosure provides a method of supporting this requirement, including meeting Design For Test ("DFT") needs of such a design.

As discussed above, some SOC designs will require multiple synchronous clocks that are tightly aligned. When a clock mesh is used for distribution of clocks, the clock mesh will operate at one frequency. Even if it was practical to provide a separate mesh for each divided clock, maintaining tight alignment between the meshes at very high clock rates can be extremely challenging due to variation that exists within different regions of one SOC or from one copy of a given SOC to another. Ideally, one would want to use a single clock mesh to distribute all of the required synchronous clocks throughout the SOC.

Chip manufacturers may also perform testing on each chip for quality control and to ensure that the components of the chip operate within certain benchmarks. To accommodate such testing of the chips, the clock circuitry should be able to provide gating of the clocks and scanning of flip flops in the design following modern Design for Test Methods.

Each synchronous clock signal is provided to respective circuitry to shape the signal. This circuitry uses a divided clock signal to drive a modification of the clock signal provided by the clock mesh to generate synchronous clock signals at frequencies at or lower than that of the clock mesh. Transmission of a given synchronous clock signal may be delayed, using one or more flip flops, such that all synchronous clock signals arrive at their respective shaper circuitry during the same clock cycle. This ensures that all the clock signals are tightly aligned to the clock signal provided by the clock mesh.

Figure 1:
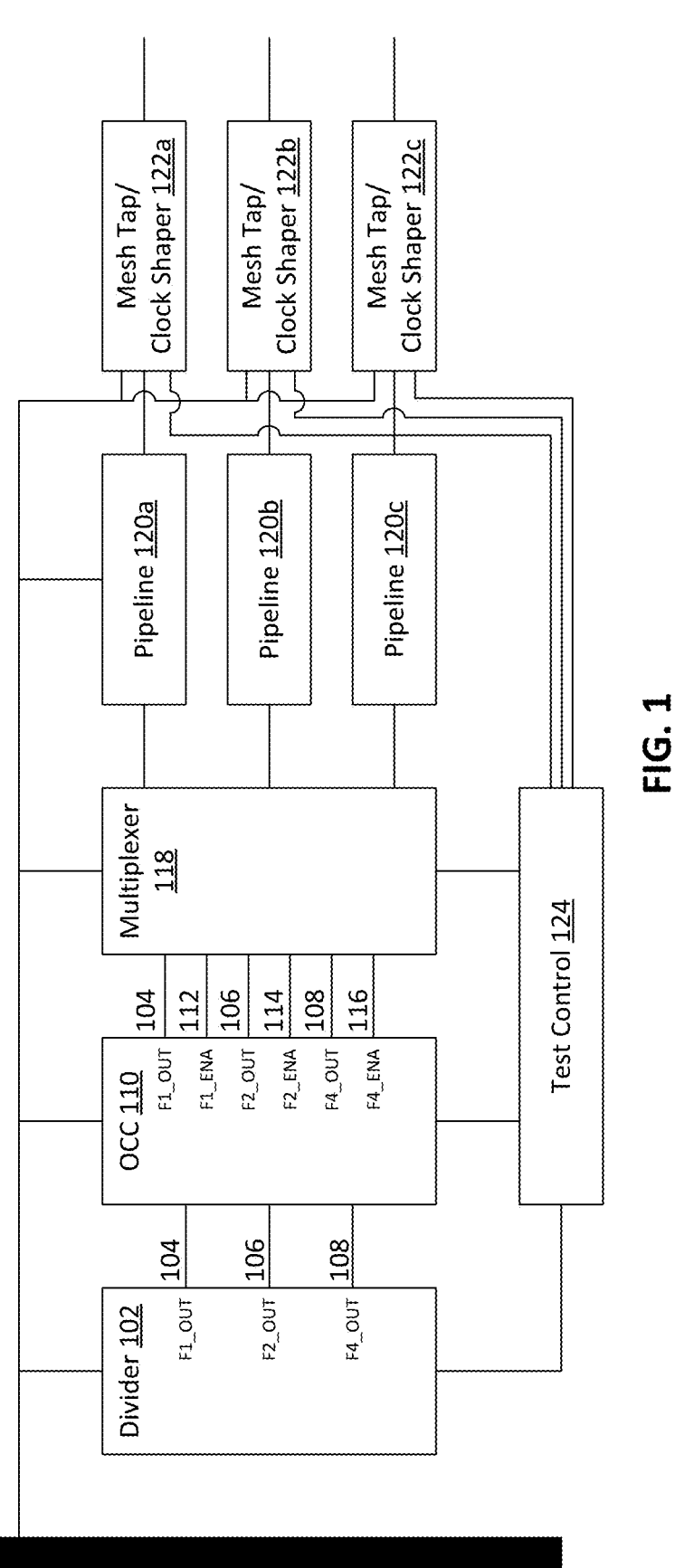
FIG. 1 shows an illustrative schematic diagram for circuitry configured to provide three synchronous clocks using a single clock mesh, in accordance with some implementations of the subject matter of this disclosure.

FIG. 1 shows an illustrative schematic diagram for circuitry configured to provide three synchronous clocks using a single clock mesh, in accordance with some implementations of this disclosure. While the implementation shown in FIG. 1 provides three synchronous clocks, the concepts described herein can be extended to support any number of synchronous clocks.

Divider 102 receives the mesh clock signal from clock mesh 100. Divider 102 includes logic or other circuitry that subjects the clock signal provided by the clock mesh to at least one divider block. In some embodiments, divider blocks may be shared by multiple paths. In some embodiments, divider blocks are not shared, or, are uniquely assigned to each designated output. F1_OUT 104 is an output of divider 102 where the mesh clock signal is divided by one. F2_OUT 106 is an output of divider 102 where the mesh clock signal is divided by two. F4_OUT 108 is an output of divider 102 where the mesh clock signal is divided by four. When indicated by the test control circuitry 124, divider 102 bypasses the divide functionality and provides all three outputs (i.e., F1_OUT 104, F2_OUT 106, and F4_OUT 108) in undivided form, i.e., at the same frequency as the clock signal provided by clock mesh 100. This allows the system to support certain testing modes for the chip on which it may be implemented. At this point in the signal chain, each of F1_OUT 104, F2_OUT 106 and F4_OUT 108 may not be tightly aligned.

OCC (on-chip clock controller) 110 receives the three clock signals (F1_OUT 104, F2_OUT 106, F4_OUT 108). Each of these clock signals can also be gated by OCC 110 in support of various testing modes. OCC 110 may gate one or more of the clock signals based on input from test control circuitry 124. For example, test control circuitry 124 may assert a signal at an input pin of OCC 110 which causes OCC 110 to gate one or more of the clock signals. In some implementations, OCC 110 may have multiple control pins through which test control circuitry 124 may control OCC 110. For example, OCC 110 may have a separate control pin for each clock received from divider 102. In addition to the three passed clock signals, OCC 110 further provides enable outputs (F1_ENA 112, F2_ENA 114, F4_ENA 116) which are each active when their corresponding clock is ungated and inactive when their corresponding clock is gated. For example, if OCC 110 receives a signal from test control circuitry 124 to gate clock F1_OUT 104 then F1_ENA 112 will be inactive. Otherwise F1_ENA 112 will be active.

During functional operation of the chip, OCC 110 will simply pass the divided clocks received from divider 102 through to multiplexer 118 with the corresponding enable signals all being set to 1. During various testing modes, however, the clocks may be gated within OCC 110 as needed to provide the required clock signals (e.g., limit or restrict the clock signals output by OCC 110) to perform testing, such as testing intended to confirm the absence of manufacturing defects in the design. The clocks may be gated in response to signals from test control circuitry 124 as described above.

Multiplexer 118 can provide one or more outputs of OCC 110 to the input of each of pipeline 120a, 120b, and 120c. The selection of which output of OCC 110 will go to which pipeline depends on the functional and test requirements for the SOC and the design of OCC 110. However, multiplexer 118 may only select from among the clocks output by OCC 110. Multiplexer 118 also has the capability to gate off any of its outputs, in addition to performing the multiplexing function. Various functional and testing modes are enabled through selection of either an enable signal or one of the clock signals to input into a pipeline. If OCC 110 is custom designed for use in this application, the functions of multiplexer 118 may be incorporated into OCC 110. However, since it is often more convenient to utilize an OCC that is provided by a DFT/ATPG tool vendor, multiplexer 118 may be utilized to ensure that the appropriate OCC output is switched to the inputs of the pipeline.

In order to assure the required alignment of clocks, all mesh tap/clock shapers (122a, 122b, 122c) should receive via the applicable pipeline (120a, 120b, 120c) the pipelined output of OCC 110 within the same time window which can be approximated using the following formula:

$$W = F - T_{setup} - T_{hold}$$

where F is the fastest clock period and $T^{setup}$ and $T^{hold}$ are determined by the flip flops used to implement the mesh tap/clock shapers.

To achieve this, each of pipeline 120a, 120b, and 120c is an N-Stage pipeline, where N is an integer. Logically, a three-stage pipeline would consist of three flip flops in a linear sequence. When implemented physically, however, the flip flops at each stage may be arranged as needed in order to meet the timing requirement stated above, along with meeting internal timing within the pipeline based upon the location of the mesh tap/clock shaper cells which they service. For example, the flip flops may be arranged in a three-level flip flop tree, with each successive level of the tree having more flip flops than the preceding level. Each pipeline may have a tree structure or other arrangement of flip flops to ensure that all of the divided clock signals arrive at a respective mesh tap/clock shaper in the same clock cycle.

The mesh tap/clock shapers may be replicated as needed as each one is only able to service an area in the order of 0.01 mm². Thus, if a block is approximately 1 mm² in area, there could be as many as 100 mesh tap/shaper blocks per clock.

Figure 2:
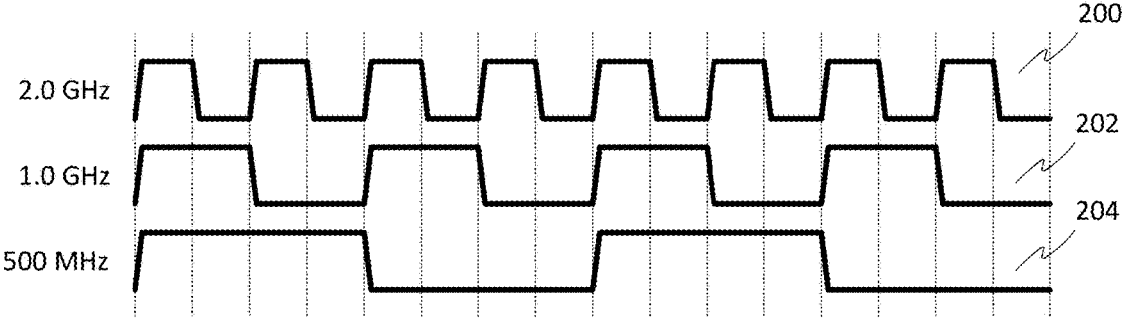
FIG. 2 depicts an illustrative series of synchronous clock signals provided by circuitry configured in accordance with some implementations of the subject matter of this disclosure.

FIG. 2 depicts an illustrative series of synchronous clock signals provided by circuitry configured in accordance with some implementations of the subject matter of this disclosure. Signal 200 represents the original 2 GHz clock signal provided by the clock mesh, and also the divide-by-1 clock signal which may simply be a pass through of the original 2

GHz clock signal. Signal 202 shows the output of a divide-by-2 circuit into which 2 GHz signal 200 is input. This stage halves the input frequency, producing a 1 GHz clock signal. Thus, each cycle of signal 202 corresponds to two cycles of signal 200. Consequently, the period of signal 202 is doubled, and the frequency halved, compared to the original period/frequency of signal 200. Signal 204 shows the output resulting from applying signal 202 to another divide-by-2 circuit, resulting in a 500 MHz signal. Here, each cycle of signal 204 corresponds to two cycles of the signal 202 (or four cycles of signal 200), giving it a period that is twice the duration of signal 202 and four times the duration of signal 200.

While the effect of the divide-by-2 circuit may be to halve the frequency of the clock signal, the operation may be different that simply dividing the frequency. Signal 200 may be modified by selectively deleting or inverting specific edges (i.e., rising or falling edges) of signal 200. This allows for precise control over the frequency, duty cycle, and phase characteristics of the signal. In one implementation, rising edge deletion can be used to eliminate a clock cycle, effectively lowering the operational frequency of the clock signal. For example, deleting every other rising edge in a 2 GHz clock would result in an output signal with a frequency similar to 1 GHz, albeit with a potentially altered duty cycle and timing regularity. Deleting falling edges, on the other hand, primarily affects the duty cycle of the clock without significantly reducing its effective frequency.

Alternatively, edge inversion allows for selective phase shifting of the clock signal. By inverting a rising edge, effectively converting it into a falling edge, the phase of the signal can be shifted by 180 degrees at that point. Similarly, inverting falling edges introduces a phase shift by delaying the low-to-high transitions. When applied repeatedly or in combination with deletion techniques, edge inversion can yield custom waveforms that incorporate both frequency and phase modifications.

These methods of edge deletion and inversion can be implemented using a variety of digital circuitry, including edge detectors and selective gating circuits that remove or invert edges based on control signals. Additionally, phase-locked loops (PLLs) and delay-locked loops (DLLs) may be employed for controlled phase and frequency adjustments, as these components can generate delayed or shifted clock signals. Programmable logic devices, such as field-programmable gate arrays (FPGAs), are also suitable for implementing edge modifications through configurable routing and logic gates. By providing the ability to delete or invert specific edges, these techniques offer a high degree of flexibility for generating clock signals with customized timing properties, which are valuable in digital systems requiring precise control over clocking, such as processors, communication systems, and power-saving applications.

Figure 3:
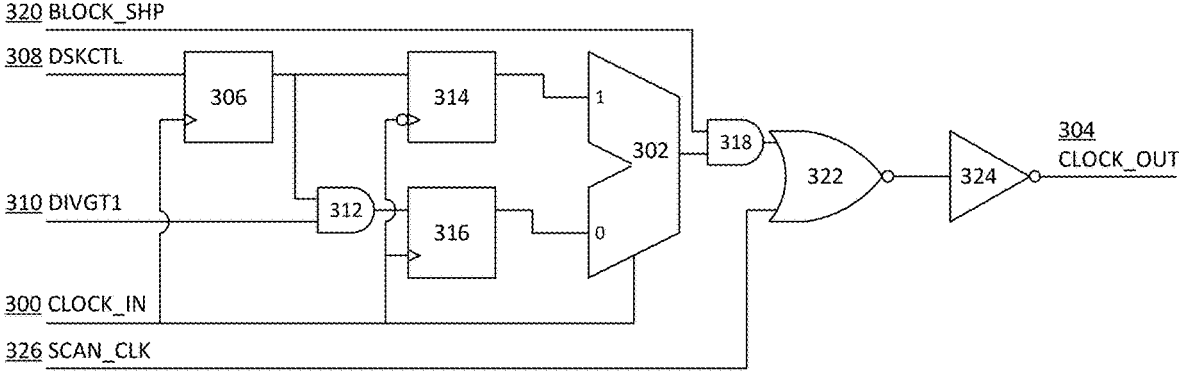
FIG. 3 is an illustrative circuit diagram depicting a logical configuration of a mesh tap/clock shaper, in accordance with some implementations of the subject matter of this disclosure.

FIG. 3 is an illustrative circuit diagram depicting a logical configuration of a mesh tap/clock shaper, in accordance with some implementations of the subject matter of this disclosure. Each mesh tap/clock shaper (e.g., mesh tap/clock shapers 122a, 122b, 122c of FIG. 1) may be implemented as hardened blocks in order to assure that critical internal timing requirements are met.

CLOCK_IN input 300 receives the undivided clock signal. This signal comes directly from the clock mesh (e.g., clock mesh 100 of FIG. 1). The clock signal received at CLOCK_IN input 300 is input into multiplexer 302. The logic driving multiplexer 302 enables multiplexer 302 to invert, delete, or maintain any of the clock edges of the clock signal received at CLOCK_IN input 300 while at the same time maintaining any required delay between CLOCK_IN input 300 and CLOCK_OUT output 304 for those edges.

For providing a divide-by-1 clock signal from the clock mesh, the clock signal present on the clock mesh is provided without any division. The clock signal received at CLOCK_IN 300 is input into flip flop 306. The DSKCTL input 308 is provided with a 1, or a high threshold voltage level, and the DIVGT1 input 310 is provided with a 0, or a low voltage threshold level. The logic 1 input to flip flop 306 allows flip flop 306 to simply output a logic 1 value. AND gate 312 receives the output from flip flop 306 and the DIVGT1 signal 310. This gate produces a high output only when both the output from flip flop 306 and DIVGT1 310 are high (i.e., logic 1). Because DIVGT1 is held low (i.e., logic 0) when the clock signal is to be passed undivided, the output of AND gate 312 is also low.

The output from flip flop 306 is also input to flip flop 314, along with the input clock signal received at CLOCK_IN 300. The input clock signal, which is inverted at flip flop 314, regulates the output of flip flop 314 to multiplexer 302. The output AND gate 312 is also input to flip flop 316, along with the input clock signal received at CLOCK_IN 300. The input clock signal regulates the output of flip flop 314 to multiplexer 302. Multiplexer 302 also receives the input clock signal from CLOCK_IN 300, which regulates the output of multiplexer 302. Flip flop 314 then receives the logic 1 value from flip flop 306 and flip flop 316 then receives the logic 0 value from AND gate 312. This causes multiplexer 302 to pass the clock signal received at CLOCK_IN 300 without modification. The output of multiplexer 302 passes through AND gate 318. During normal operation of the mesh tap/clock shaper circuitry, BLOCK_SHP input 320 is provided with a 1, or a high threshold voltage level. This input may be provided by, e.g., test control circuitry 124. Thus, each clock pulse output from multiplexer 302 is able to pass through AND gate 318. In some implementations, AND gate 318 may be located between flip flop 314 and multiplexer 302, rather than at the output of multiplexer 302 as shown in FIG. 3.

For divisors of the clock signal other than 1, the corresponding divided clock is applied to the DSKCTL input 308 and a 1, or a high voltage threshold level, is provided to the DIVGT1 input 310. This signal may be an enable signal (e.g., F2_ENA 114) output by OCC 110. This causes the mesh tap/clock shaper to invert or delete edges of the clock signal received from the clock mesh based on the divided clock signal applied to the DSKCTL input 308. The divided clock signal is output from flip flop 306 to AND gate 312. Since DIVGT1 310 is high, the divided clock signal is able to pass through AND gate 312 to flip flop 316. Flip flop 316 is regulated by the input clock signal. Thus, high and low portions of the divided clock signal are generated from flip flop 314 and flip flop 316, respectively, which are then input into multiplexer 302.

The output of multiplexer 302, when allowed to pass through AND gate 318, is input into NOR gate 322. During normal operation, when the output clock signal from multiplexer/inverter 302 is high, the output of NOR gate 322 will be low. This output then passes through inverter 324 to be output at CLOCK_OUT 304 as a clock signal for driving other logic.

When used to perform local clock division of the clock signal provided by the clock mesh, the edges of the resulting clocks will be very closely aligned to the edges on the clock mesh, even if the divisors for two mesh tap/clock shapers are different. For even divisors, a 50/50 clock will be achieved.

For odd divisors, a slightly asymmetric clock will result. If DSKCTL is held to a 0 state, the output of multiplexer 302 is 0, blocking the clock.

To enable scan-based testing of the flip flops driven by a particular mesh tap/clock shaper, a scan clock signal, which may be generated by a test control circuit (e.g., test control circuitry 112), is applied to SCAN_CLK input 326. The scan clock typically has a frequency that is less than 200 MHz and distributed via a non-mesh style clock tree. The output of multiplexer 302 would be zero while scanning is underway. For example, the test control circuitry may block all clock signal outputs from the OCC while generating the scan clock. This would result in the mesh tap/clock shaper receiving no signals at either CLOCK_IN input 300 or DSKCTL input 308.

In some cases, when passing the scan clock signal through the mesh tap/clock shaper, it may be difficult to initialize the flip flops that are part of the mesh tap/clock shaper circuit. This can cause an indeterminate value to be present at NOR gate 322 and potentially prevent the scan clock signal form passing through it. To ensure that the scan clock signal is able to pass through NOR gate 322, a 0, or low voltage threshold level, is applied to BLOCK_SHP input 320 while scanning is underway.

FIG. 4 is a flow diagram representing an illustrative process 400 for generating multiple synchronous clocks using a single clock mesh, in accordance with some implementations of the subject matter of this disclosure. At 402, a first clock signal at a first frequency is provided using a single clock mesh. Typically, a clock mesh is driven by several clock drivers that inject a clock signal into different points on the mesh. Using multiple clock sources reduces skew (i.e., timing differences) across the chip. The mesh structure also inherently provides low skew by averaging out variations in signal propagation across different paths. In contrast to traditional tree structures, where a single line feeds multiple branches, the mesh distributes the signal more uniformly.

At 404, a plurality of divided clock signals are generated. Each divided clock signal oscillates at a frequency that is a respective integer division of the first frequency. In some implementations, each divided clock signal is generated by dividing the first frequency by a power of two. This may be accomplished using a series of divide-by-2 circuits, where the divided clock signal output of a first divide-by-2 circuit is then input into a second divide-by-2 circuit to produce a divide-by-4 clock signal.

At 406, the divided clock signals are received at a clock controller. The clock controller may then output the divided clock signals and a corresponding enable signal for each divided clock signal. During testing, the clock controller may receive inputs from a test control circuit to gate one or more of the divided clock signals.

At 408, a shaped clock signal is generated for each divided clock signal. In each shaped clock signal, the rising edges and falling edges of the shaped clock signal are aligned with rising edges and falling edges of the first clock signal provided by the single clock mesh.

Thus it is seen that methods and systems for supporting multiple synchronous clocks with a single clock mesh have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. An electronic device for supporting multiple synchronous clocks with a single clock mesh, the electronic device comprising:
   a single clock mesh configured to provide a first clock signal at a first frequency;
   divider circuitry configured to generate a plurality of divided clock signals, each divided clock signal being at a frequency that is a respective integer division of the first frequency;
   an on-chip clock controller configured to receive the divided clock signals, and output the divided clock signals and corresponding enable signals for each divided clock signal; and
   clock shaper circuitry configured to generate, for each divided clock signal, a shaped clock signal having rising edges and falling edges aligned with rising edges and falling edges of the first clock signal provided by the single clock mesh.

2. The electronic device of claim 1, further comprising:
   a multiplexer configured to receive the divided clock signals and corresponding enable signals from the on-chip clock controller and transmit, for each respective divided clock signal, one of the respective divided clock signal or its corresponding enable signal.

3. The electronic device of claim 1, further comprising:
   a plurality of flip flops arranged in a sequence of flip flops such that an output of any first flip flop of the plurality of flip flops, other than a last flip flop, is input into a next flip flop in the sequence, wherein a divided clock signal from the on-chip clock controller is input into the sequence of flip flops and output, from the last flip flop of the sequence of flip flops, to the clock shaper circuitry.

4. The electronic device of claim 3, wherein the plurality of flip flops comprises a tree of flip flops allowing the signal to be duplicated and sent along parallel paths to different receiving components.

5. The electronic device of claim 3, wherein the plurality of flip flops is configured to ensure that each divided clock signal arrives at the clock shaper circuitry during a first clock cycle.

6. The electronic device of claim 1, further comprising control circuitry configured to:
   select one or more of the plurality of divided clock signals; and
   gate the selected one or more divided clock signals.

7. The electronic device of claim 6, further comprising:
   a respective plurality of flip flops coupled to the output of the clock shaper circuitry for each divided clock signal;
   wherein:
   the control circuitry is further configured to, while gating at least one of the plurality of divided clock signals, scan the respective plurality of flip flops associated with the at least one of the plurality of divided clock signals.

8. A method for supporting multiple synchronous clocks with a single clock mesh, the method comprising:
   providing a first clock signal at a first frequency using a single clock mesh;
   generating a plurality of divided clock signals, each divided clock signal being at a frequency that is a respective integer division of the first frequency;

receiving the divided clock signals and outputting the divided clock signals and corresponding enable signals for each divided clock signal; and generating, for each divided clock signal, a shaped clock signal having rising edges and falling edges aligned with rising edges and falling edges of the first clock signal provided by the single clock mesh.

9. The method of claim 8, further comprising:

receiving the divided clock signals and corresponding enable signals and transmitting, for each respective divided clock signal, one of the respective divided clock signal or its corresponding enable signal.

10. The method of claim 8, further comprising:

delaying transmission of a divided clock signal to ensure transmission of the divided clock signal after a specific number of clock cycles.

11. The method of claim 10, further comprising delaying transmission of a second divided clock signal to ensure that the divided clock signal and the second divided clock signal are transmitted during the same clock cycle.

12. The method of claim 8, further comprising:

selecting one or more of the plurality of divided clock signals; and gating the selected one or more divided clock signals.

13. The method of claim 12, further comprising, while gating at least one of the plurality of divided clock signals, scanning a plurality of flip flops associated with the at least one of the plurality of divided clock signals.

14. The method of claim 13, further comprising generating a scan clock signal at a frequency that is below a frequency of the respective divided clock signal associated with the plurality of flip flops.

15. A system for supporting multiple synchronous clocks with a single clock mesh, comprising:

a clock mesh configured to provide a first clock signal at a first frequency;

one or more electronic components, each of which is configured to operate using a respective clock signal at a respective different frequency lower than the first frequency, the respective different frequency being an integer division of the first frequency, a plurality of different frequencies being used among the one or more electronic components; and clock circuitry configured to:

generate, from the first clock signal, one or more divided clock signals, wherein each divided clock signal has a frequency that is an integer division of the first frequency, and wherein each respective divided clock signal corresponds to a respective frequency among the plurality of different frequencies, and shape each of the one or more divided clock signals such that each divided clock signal has a rising edge that aligns with a rising edge of the first clock signal and a falling edge that aligns with a falling edge of the first clock signal.

16. The apparatus of claim 15, further comprising:

a multiplexer configured to receive the divided clock signals and corresponding enable signals and transmit, for each respective divided clock signal, one of the respective divided clock signal or its corresponding enable signal.

17. The system of claim 15, further comprising:

a plurality of flip flops, the plurality of flip flops being arranged in a sequence of flip flops such than an output of a first flip flop of the plurality of flip flops is input into a next flip flop in the sequence, wherein a divided clock signal is input into the sequence of flip flops and output, from a last flip flop of the sequence of flip flops, to the clock circuitry configured to shape each divided clock signal.

18. The system of claim 17, wherein the plurality of flip flops is configured to ensure that each divided clock signal arrives at the control circuitry configured to shape each divided clock signal during the same clock cycle.

19. The system of claim 15, further comprising control circuitry configured to:

select one or more of the plurality of divided clock signals; and gate the selected one or more divided clock signals.

20. The system of claim 19, further comprising:

a respective plurality of flip flops coupled to an output of the clock shaper circuitry for each divided clock signal; wherein:

the control circuitry is further configured to, while gating at least one of the plurality of divided clock signals, scan the respective plurality of flip flops associated with the at least one of the plurality of divided clock signals.

* * * * *